(12) United States Patent
Allen

(10) Patent No.: US 8,205,400 B2
(45) Date of Patent: Jun. 26, 2012

(54) SOLAR PANEL ROOF KIT

(75) Inventor: Gary E Allen, Rochester, MI (US)

(73) Assignee: Luma Resources, LLC, Rochester Hills, MI (US)

( * ) Notice: Subject to any disclaimer, the term of this patent is extended or adjusted under 35 U.S.C. 154(b) by 594 days.

(21) Appl. No.: 12/190,068

(22) Filed: Aug. 12, 2008

(65) Prior Publication Data

US 2008/0313976 A1    Dec. 25, 2008

Related U.S. Application Data

(63) Continuation-in-part of application No. 11/780,721, filed on Jul. 20, 2007, now abandoned.

(60) Provisional application No. 60/888,875, filed on Feb. 8, 2007.

(51) Int. Cl.
*E04D 13/18* (2006.01)

(52) U.S. Cl. .......... 52/173.3; 52/302.1; 52/533; 52/539; 136/244

(58) Field of Classification Search .......... 52/173.3, 52/27, 90.2, 302.1, 302.3, 302.6, 412, 539, 52/536, 533; 136/244; 126/623
See application file for complete search history.

(56) References Cited

U.S. PATENT DOCUMENTS

| | | | | |
|---|---|---|---|---|
| 4,450,665 A | * | 5/1984 | Katz | 52/522 |
| 4,572,161 A | | 2/1986 | Mori | |
| 4,930,287 A | * | 6/1990 | Volk et al. | 52/748.11 |
| 5,651,837 A | | 7/1997 | Ohtsuka et al. | |
| 5,878,543 A | * | 3/1999 | Mowery | 52/519 |
| 5,946,876 A | * | 9/1999 | Grace et al. | 52/520 |
| 6,232,544 B1 | * | 5/2001 | Takabayashi | 136/244 |
| 6,298,625 B1 | * | 10/2001 | Sweet | 52/519 |
| 6,465,724 B1 | * | 10/2002 | Garvison et al. | 136/244 |
| 6,521,821 B2 | | 2/2003 | Makita et al. | |
| 6,534,702 B1 | | 3/2003 | Makita et al. | |
| 6,541,693 B2 | * | 4/2003 | Takada et al. | 136/244 |
| 6,552,258 B2 | * | 4/2003 | Kinoshita et al. | 136/251 |
| 6,606,830 B2 | * | 8/2003 | Nagao et al. | 52/173.3 |
| 6,960,716 B2 | * | 11/2005 | Matsumi et al. | 136/244 |
| 6,971,756 B2 | | 12/2005 | Vasylyev | |
| 7,775,009 B2 | * | 8/2010 | King | 52/520 |

(Continued)

FOREIGN PATENT DOCUMENTS

JP    2002-170978    6/2002

(Continued)

OTHER PUBLICATIONS

Open Energy internet pages, Chris Cornel Residential House, Re-Roof Application, Nov. 15, 2006.

(Continued)

*Primary Examiner* — Robert Canfield
*Assistant Examiner* — Matthew Gitlin
(74) *Attorney, Agent, or Firm* — Reising Ethington P.C.

(57) ABSTRACT

A solar roofing system is described that is adapted for managing the flow of water down a roof. The system includes at least one roofing panel adapted for supporting photovoltaic material and at least one splice plate for interconnecting adjacent roofing panels. The roofing panels have a trough adapted for receiving water flowing down the roof and redistributing the water away from the splice plate. Anchoring clips secure roofing panels to the roof and space roofing panels from the roof for improved air circulation beneath the panels. Closure assemblies are used at edges of roofing panels to conceal electrical wiring from photovoltaic material sheets and to close off edge gaps formed by a terraced roofing system.

6 Claims, 11 Drawing Sheets

U.S. PATENT DOCUMENTS

| | | | |
|---|---|---|---|
| 2001/0034982 A1* | 11/2001 | Nagao et al. | 52/173.3 |
| 2001/0050102 A1* | 12/2001 | Matsumi et al. | 136/244 |
| 2002/0083672 A1* | 7/2002 | Ostenfeldt | 52/536 |
| 2003/0154666 A1* | 8/2003 | Dinwoodie | 52/173.3 |
| 2003/0192282 A1* | 10/2003 | Bullinger et al. | 52/539 |
| 2005/0229924 A1 | 10/2005 | Luconi | |
| 2010/0154784 A1* | 6/2010 | King et al. | 126/623 |

FOREIGN PATENT DOCUMENTS

| | | |
|---|---|---|
| JP | 2002-170979 | 6/2002 |
| JP | 2002-270886 | 9/2002 |
| JP | 2002-276086 | 9/2002 |
| JP | 2003-279165 | 10/2003 |

OTHER PUBLICATIONS

Dawn Solar, News Release, "Dawn Solar demonstrates broader line of renewable energy systems at Metalcon International 2006," Oct. 2, 2006.

Dawn Solar Brochure, 2006, www.dawnsolar.com.

Berridge Manufacturing Co. Specification, Feb. 17, 1992.

Berridge Manufacturing Co. brochure, 2005, www.berridge.com/bermroof.htm.

Overly Manufacturing Company drawings from the Internet.

Uni-Solar brochures and web pages.

* cited by examiner

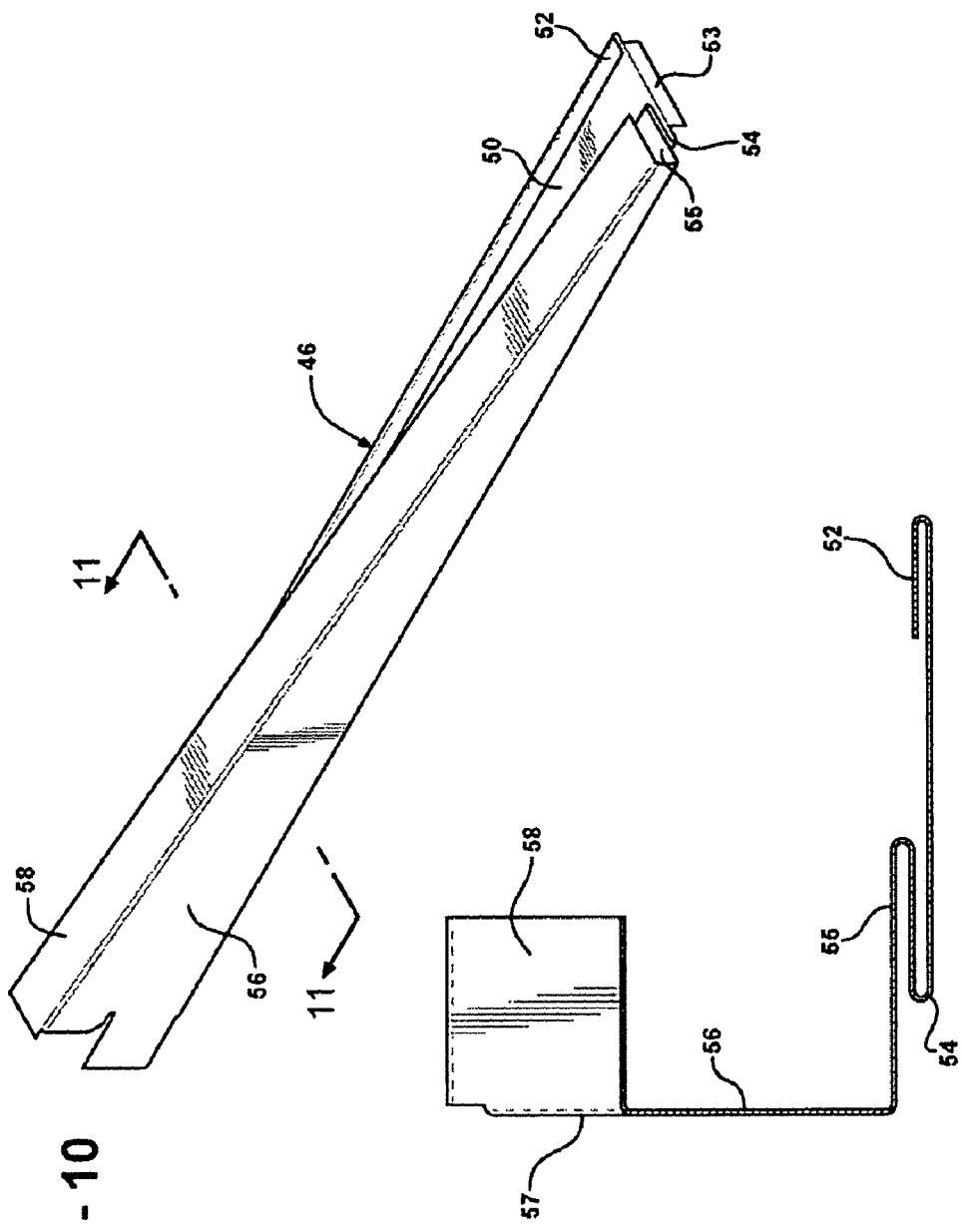

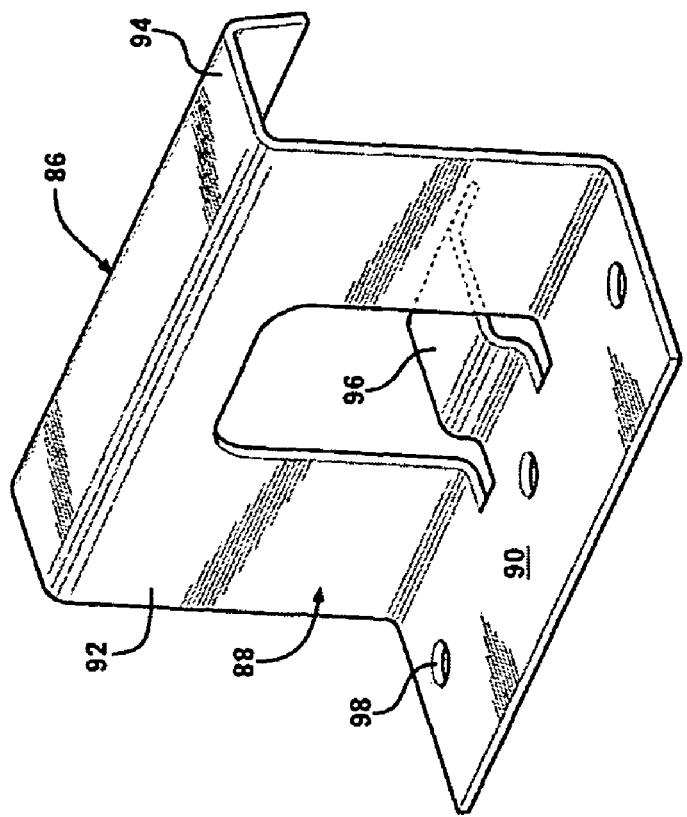
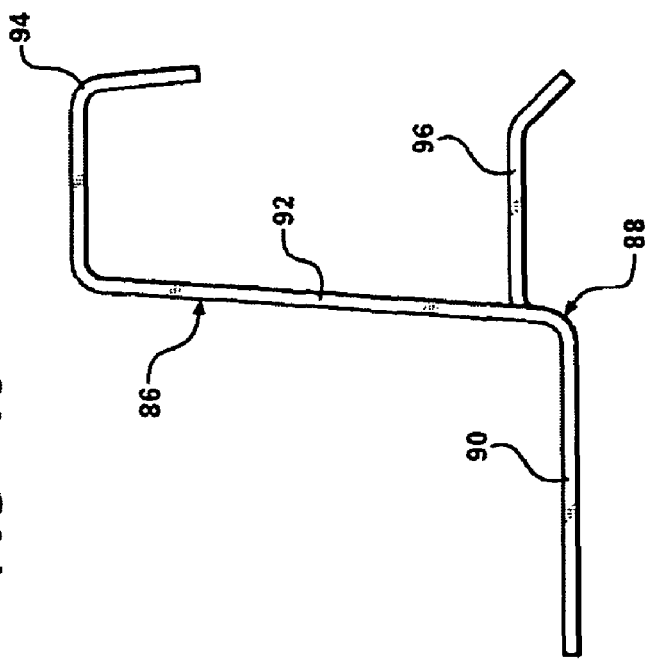

SOLAR PANEL ROOF KIT

RELATED APPLICATIONS

This application is a continuation-in-part of U.S. patent application Ser. No. 11/780,721, filed Jul. 20, 2007, which claims the benefit of U.S. Provisional Patent Application 60/888,875, filed Feb. 8, 2007. The disclosures of the above applications are incorporated herein by reference.

TECHNICAL FIELD

The present invention relates to the use of solar panels on roofs, and more particularly to the roofing components for supporting pre-manufactured sheets or strips of photovoltaic material.

BACKGROUND

Photovoltaic material is well-known by now and readily commercially available in a variety of forms. For example, United Solar Ovonics advertises products under the name Uni-Solar® on its web site, www.uni-solar.com. These photovoltaic products come in shingle form and in sheet form. BP Solar and other companies like Guangdong Fivestar Solar Energy Company Ltd. also supply photovoltaic material.

As to the material sold in sheet form, the sheets are often sold in rolls of sheet that can be rolled out on a roof and installed fairly conveniently by means of adhesive backing material. The sheet material is relatively inexpensive and light weight; and it generates electricity from solar energy in many weather conditions. The photovoltaic material may also be made in strips or in rigid panel form. In any case, on any given roof, the installer may need to apply several sheets or panels to cover the desired portion. The inventor here recognized that this poses several challenges—especially on roofs having any significant slope or pitch.

First, the sheets will present multiple edges that will buck water flowing down off the roof. Over time, the water can cause the edges to lift, which creates the possibility that the water can flow under the sheets, which can damage the sheets and the roofing underneath the sheets. This is not as much of a problem when the photovoltaic material is sold in shingle form; but when it is sold in sheet form for application on metal roofs and the like, there could be more of a problem over time.

Also, while the sheets have a favorable fire safety rating on low-pitched roofs, they have a lower rating on higher pitched roofs. It is commercially significant to have a favorable fire safety rating on a variety of roof pitches, so something needed to be done to address this.

Still further, if the photovoltaic sheets lie flat on the roofing substrate, there is an issue about where to put the electrical wiring. Ideally, the wiring should stow neatly underneath the sheeting where it is protected and out of sight.

Finally, there are a number of technical problems—including those just discussed—that need to be solved in order to install a typical system on a roof in a way that meets common roofing standards. The system should be durable and robust, and it should of course prevent leaking for many years. Because these problems will arise every time someone installs the typical system, the inventor appreciated that there is a need for a kit of common components that can be used to solve these problems efficiently and correctly every time the typical system, or one like it, is installed.

SUMMARY OF THE INVENTION

The inventor has an improved roofing system for supporting sheets of photovoltaic material on a roof. According to one aspect of the invention, there is a roofing panel for supporting photovoltaic material on a roof comprising a support plate, a riser extending from an upstream edge of the support plate to an end that is elevated above the support plate, and a receiving flange extending over the support plate from the end of the riser. The receiving flange includes a trough formed therein for receiving water flowing down the roof and distributing the water over the support plate. There is a hem formed on a downstream edge of the support plate shaped to engage at least a portion of a receiving flange of an adjacent downstream roofing panel, wherein photovoltaic material of a predetermined thickness can be disposed over the support plate and an upstream edge of the photovoltaic material can be disposed under the trough.

According to another aspect of the invention there is a splice plate for interconnecting adjacent roofing panels comprising a slot housing defining first and second slots in opposing directions for receiving edges of first and second roofing panels, a first apron adjacent the first slot for extending under the first panel, a second apron adjacent the second slot for extending under the second panel, a first tab extending from a downstream edge of the first apron, and a second tab extending from a downstream edge of the second apron. Each tab is configured to extend into a trough of a downstream roofing panel to allow water to flow away from the splice plate.

Another aspect of the invention is a closure assembly for the side of a roofing panel mounted to a roof. The closure assembly comprises a cover support including an apron with an edge for extending under the roofing panel; a slot housing connected to an opposite edge of the apron, the slot housing defining a slot for receiving an edge of the roofing panel; and a pocket housing disposed above the slot housing and defining a pocket for receiving an edge of a receiving flange of the roofing panel.

Another aspect of the invention is an anchoring clip for securing a roofing panel to a roof. The anchoring clip comprises a bracket portion comprising a base for attaching to the roof and a support extending from the base; a hem extending from the support, wherein the hem is shaped to engage at least a portion of a receiving flange of the roofing panel; and a spacing element extending from the bracket portion and beneath the hem to space an edge of the roofing panel from the roof to allow air circulation beneath adjacent roofing panels.

By applying the invention in its various aspects, one can install a robust solar roofing system efficiently and inexpensively. The materials, especially when provided as a kit, can provide an inexpensive, yet well-engineered and easily manufactured and installable solar roofing system. Roofer contractors and even do-it-yourself homeowners can buy the system as a kit and install it, with simple electrical connections that can be completed by an electrician.

FIGURES IN THE DRAWINGS (NEEDS UPDATE)

FIG. 10 is a perspective view of an embodiment of a closure support;

FIG. 11 is a section view of an embodiment of the closure support taken along lines 11-11;

FIG. 13 is a side view of an embodiment of an anchoring clip; and

FIG. 14 is a perspective view of an embodiment of an anchoring clip.

DETAILED DESCRIPTION OF THE PREFERRED EMBODIMENTS

Figure 1:
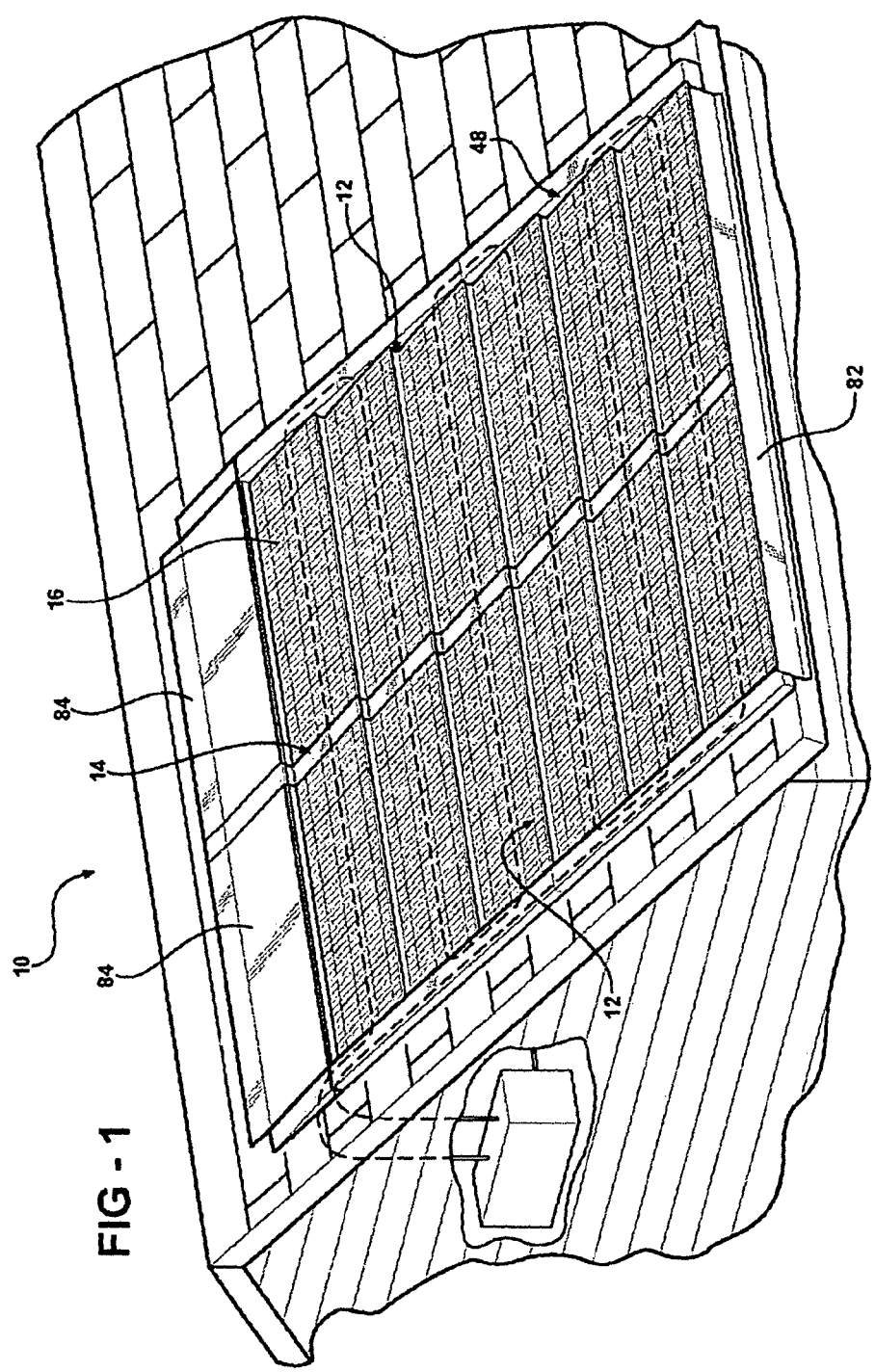
FIG. 1 is a perspective view of a roof with a complete kit of solar panels assembled on it.
Figure 2:
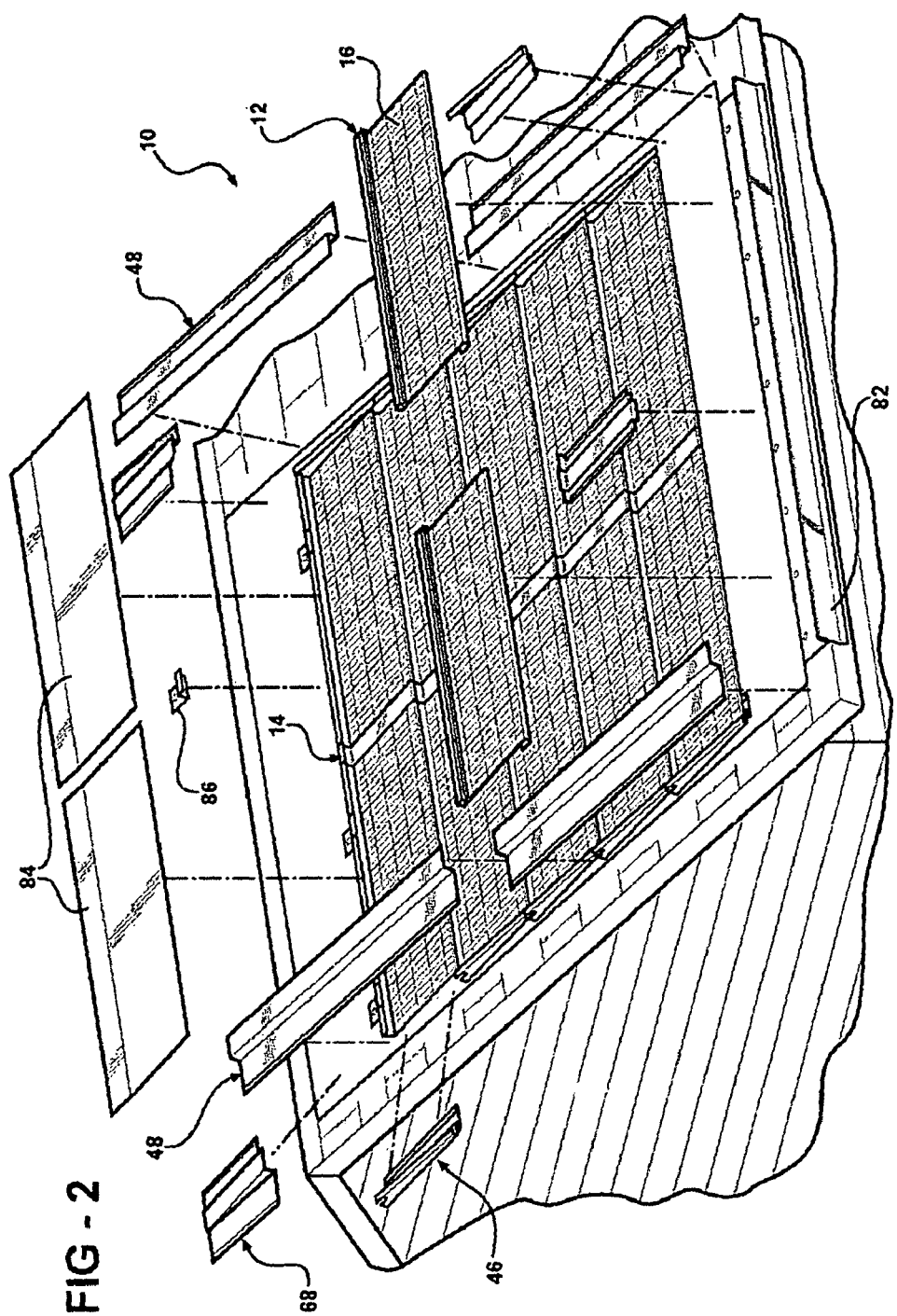
FIG. 2 is a similar view with components of the kit exploded away.

The system or kit is generally shown at 10 in the Figures and includes a variety of components—chiefly: a series of roofing panels generally indicated at 12, splice plates generally indicated at 14 for interconnecting the roofing panels in a waterproof manner; anchoring clips generally indicated at 86 for securing the roofing panels to a roof; various closures; various top, bottom and side flashings; and miscellaneous other pieces and trim. These components can be supplied as a kit and assembled in place on a roof for providing a robust system, where the system supports the photovoltaic sheets 16 and their respective wiring and electronics to generate electricity. A typical kit is shown in FIGS. 1 and 2. The figures show a kit that has two columns of panels with six panels in a column. But the size can and will vary depending on the desired electrical output and available roof space.

The Uni-Solar.com web site includes specification materials for various types of the photovoltaic material commercially available from Uni-Solar®. The typical sheet 16 has photovoltaic material and an adhesive 17 on a back surface of the sheet so that the sheet can be applied to the flat portion of a roofing panel 12 with the adhesive bonding to the flat portion. The adhesive can be an ethylene propylene copolymer adhesive sealant, and it can include a microbial inhibitor. The sheet 16 has amorphous solar cells encapsulated in a high light transmissive polymer, where the high light transmissive polymer can be ETFE. Other types of photovoltaic sheet other than Uni-Solar® can be used with the kit 10, and some of these other types are referenced above. One such type is available from Xunlight Corporation in Toledo, Ohio (www.xunlight.com). Another type is available from Gloria Spire Solar in Bedford, Mass. (www.gloriaspire.com). Still others are referenced on the internet.

Of course, the components are also selected to provide a roofing system 10 that functions to provide dry, leak-free shelter under the roof. The inventive system 10 could involve metal roofing components together with the photovoltaic sheeting 16, but it is likely that the system has applicability and benefit for other types of roofing that are not necessarily metal.

Figure 3:
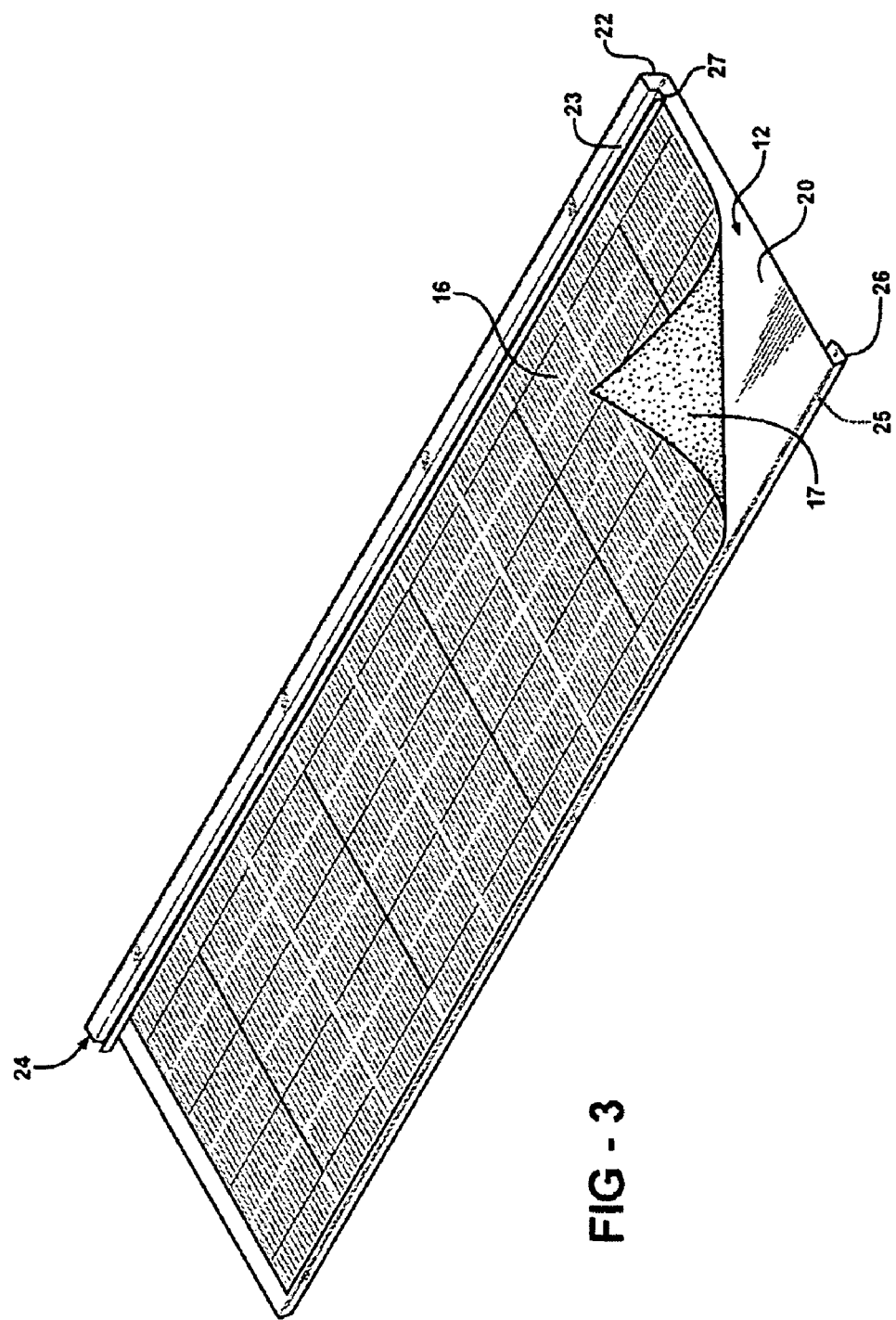
FIG. 3 is a perspective view of a roofing panel from the kit with a corner of photovoltaic material peeled back.

The system 10 includes at least one roofing panel 12 having a support plate 20 adapted to support the photovoltaic sheet 16. This is shown most clearly in FIGS. 3 and 4. The support plate 20 is simply the relatively large surface-area portion of the roofing panel 12 that is sized to receive the sheet 16 of the photovoltaic material having a known dimension. As mentioned above, the sheet material 16 may come with a pre-applied adhesive 17 for attaching the sheet to the support plate 20.

A rib or riser 22 extends generally perpendicularly from an edge of the support plate 20 to an end that is elevated above the support plate. As shown in the figures, the edge for the riser 22 is usually the upstream edge (i.e. the higher edge when the plate is installed on a sloped roof). A receiving flange 24 extends over the support plate 20 from the end of the riser 22. A trough 23 is formed in the receiving flange 24. The purpose of the trough 23 is to receive water that may flow down the roof over the roofing panels 12 and splice plates 14 of the roofing system. The trough 23 distributes the flowing water over the support plate 20 of roofing panel 12, and more specifically over the sheet of photovoltaic material 16 when it is installed on the support plate 20. The trough 23 is shown in the figures generally as a U-shaped channel with its open end facing up, but the trough may have any shape that collects water and allows water to flow and be distributed over the support plate 20. The trough 23 may also define one or more weep holes 25 for allowing water to drain from the trough and flow down the roofing panel. An example of a weep hole 25 is shown in cross-section in FIG. 7.

The riser 22 extends a predetermined distance above the level of the support plate 20 such that the distance between a trough bottom 27 and the support plate 20 is greater than the thickness of the photovoltaic sheet material 16 so that the receiving flange 24 including the trough 23 can extend over the photovoltaic material 16 when it is installed on the support plate 12. An upstream edge of the sheet of photovoltaic material 16 may be disposed under the trough 23 and may be in abutting arrangement with the riser 22 to prevent water draining from the trough 23 from collecting at the upstream edge of the photovoltaic material 16 or seeping beneath the photovoltaic sheet 16. The height of the riser 22 will be selected to optimize fire retardation, water flow off the roofing panels 12, manufacturing and material cost considerations, clearance for electrical wiring, and other considerations. The point of the riser 22 is to elevate the edge of the next roofing panel so that a terrace effect is created.

Adjacent upstream and downstream roofing panels 12 can engage one another in a variety of ways. According to one possible embodiment, the receiving flange 24 extends generally perpendicularly from the end of the riser 22 back over the support plate 20. A hem 26 extends from an opposite edge of the support plate 20, usually the downstream edge as indicated in the figures. The hem 26 is adapted or shaped to engage at least a portion of a receiving flange 24 on another roofing panel 12 when the roofing panel is mounted on the roof adjacent other roofing panels. The hem 26 is typically formed by bending the edge of the support plate 12 back under itself into a shape that can engage a portion of an adjacent receiving flange 24. The term "hem" is intended to broadly describe hooks, clips, and similar structures that allow the one roofing panel 12 to engage the other. In the embodiment shown in the figures, the hem 26 is shaped to engage the bottom 27 of the trough 23 of the adjacent roofing panel. In such embodiments where the hem engages the bottom 27 of the trough 23, the hem 26 may define at least one weep hole 25 for draining water from the hem 26. One or more weep hole 25 in the hem 26 may correspond or be in alignment with one or more weep hole 25 in the trough 23 to facilitate drainage of water from the trough. Other ways of engaging an adjacent roofing panel 12 are possible. For example, the edge of an adjacent roofing panel 12 could simply rest on top of the riser 22. It is also possible for the hem 26 of a roofing panel 12 to engage an inside surface of the trough 23 of an adjacent roofing panel or to engage another portion of the receiving flange 24 and not extend under the trough 23.

The typical roofing panel 12 can be formed from a single piece of sheet metal using conventional metal-bending techniques. Clearance holes 28 may be formed in the roofing panel 12 to provide clearance for electrical connectors and wiring. While metal bending is one possibility, other techniques like extrusion or molding can be used. Moreover, materials other than metal can be used, including composites and plastics.

Figure 4:
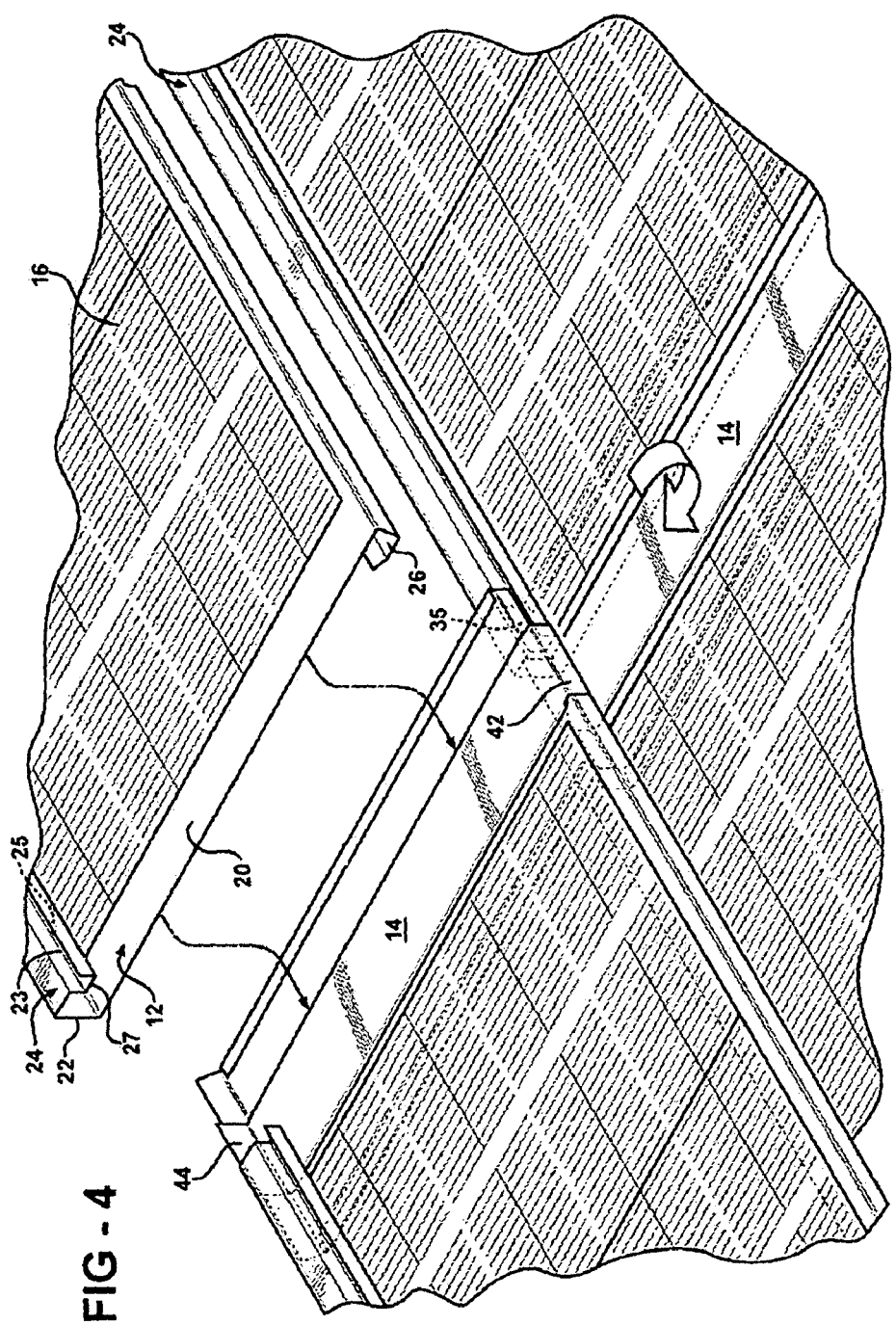
FIG. 4 is a perspective view showing how roofing panels are joined at their edges with splice plates.
Figure 5:
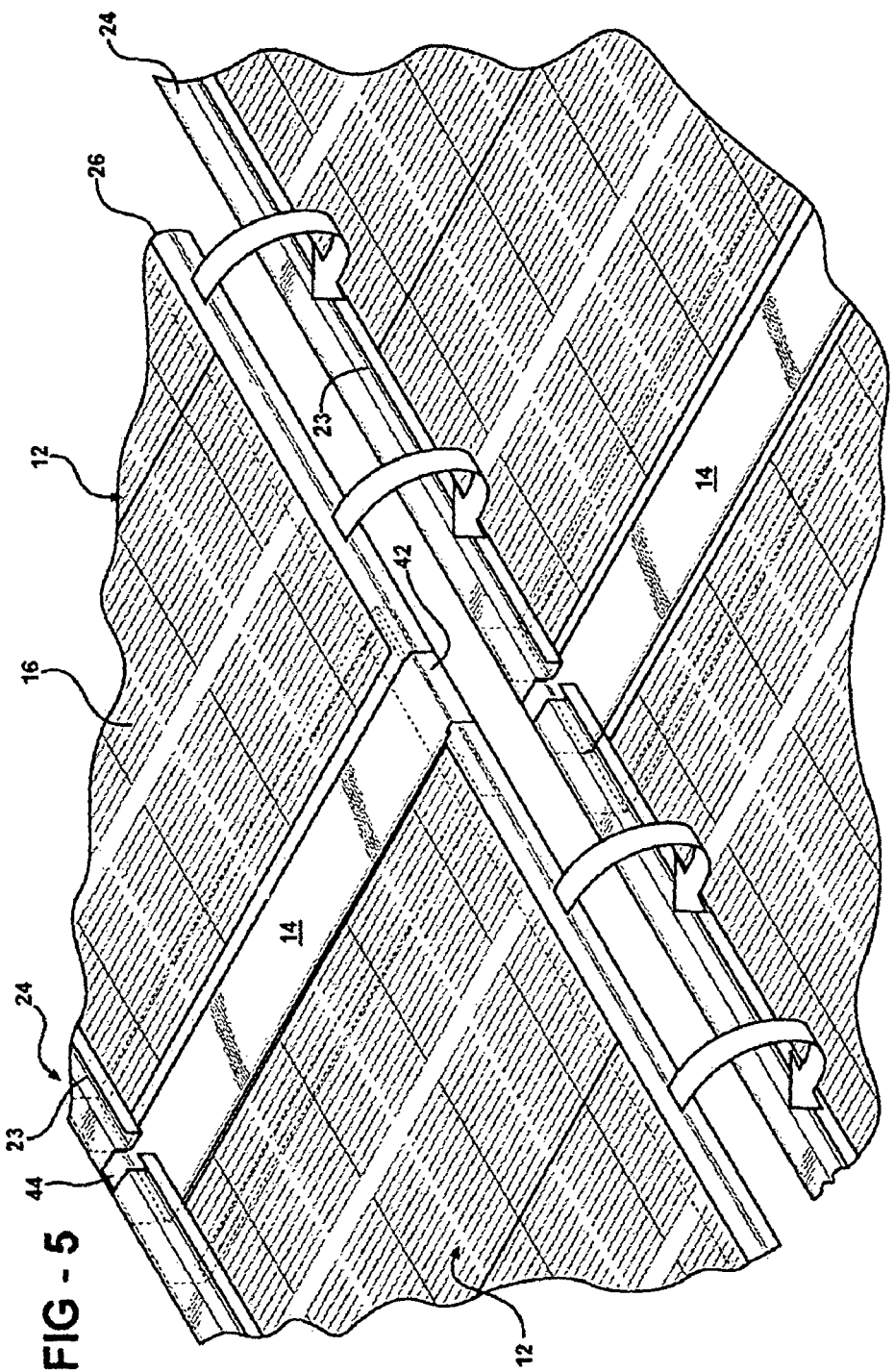
FIG. 5 is a perspective view showing how roofing panels are joined top to bottom.
Figure 6:
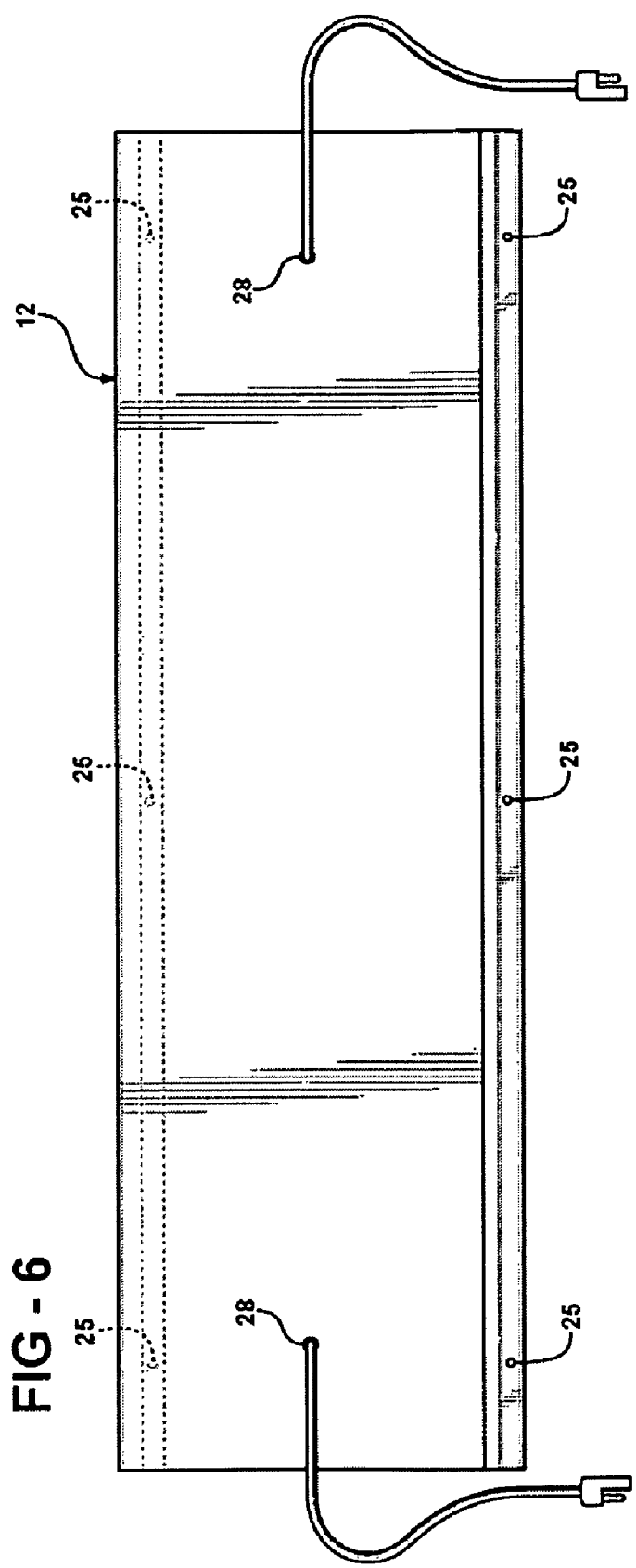
FIG. 6 is a bottom view of a roofing panel.
Figure 8:
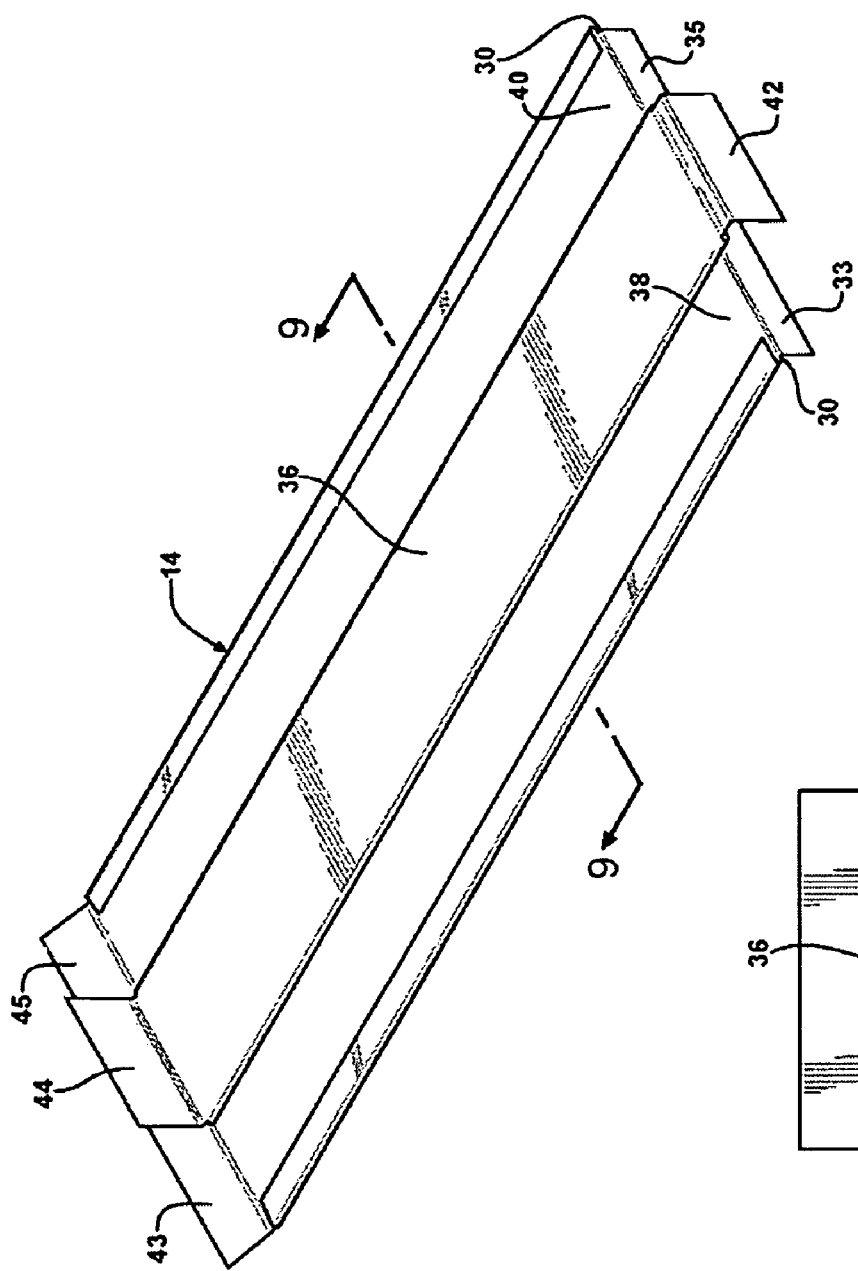
FIG. 8 is a perspective view of an embodiment of a splice plate.
Figure 9:
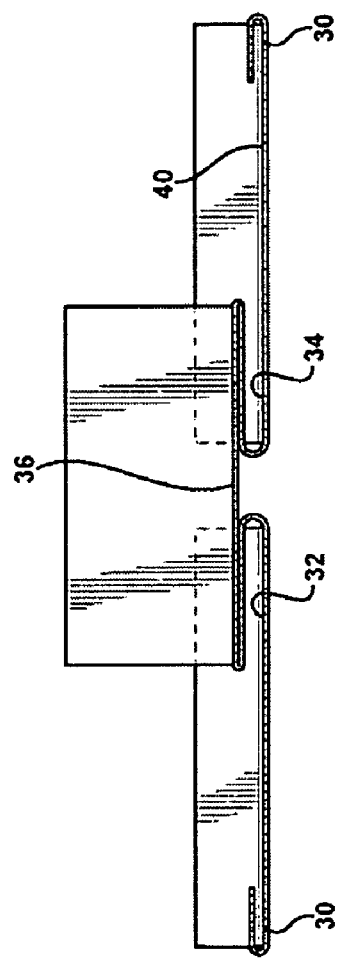
FIG. 9 is a section view of the an embodiment of a splice plate taken along lines 9-9.

The system also includes at least one splice plate generally indicated at 14 for interconnecting laterally disposed first and second roofing panels 12. The splice plate 14 is shown in connection with the kit 10 in FIGS. 1, 2, 4, and 5. It is also shown alone in FIGS. 8 and 9. The splice plate 14 includes a slot housing 36 defining first and second slots 32, 34 in opposing directions for receiving edges from first and second roofing panels 12, respectively. A first apron 38 connected to the slot housing adjacent the first slot 32 can extend under the first roofing panel. The first apron 38 terminates in a distal check 30. A second apron 40 connected to the slot housing adjacent the second slot 34 can extend under the second roofing panel. The second apron terminates in a distal check 30. The first and second aprons 38, 40 include first and second tabs 33 and 35, respectively. The first and second tabs 33, 35 extend from the downstream edges of the first and second aprons 38, 40. The first and second tabs 33, 35 are configured to extend into the trough 23 of a downstream roofing panel 12. This is best shown in FIG. 4. As a result, water flowing down the roofing system, particularly water flowing between laterally disposed roofing panels, is caught and channeled by the checks 30 and slots 32, 34 of the splice plate 14 and directed into the trough 23 of a downstream roofing panel 12 by the splice plate tabs 33, 35. In this manner, water can be directed away from a splice plate 14 that interconnects laterally disposed roofing panels and can be distributed over downstream roofing panels 12 to flow down and off of the roofing system.

A splice plate 14 may also include a concealing tab 42 extending from a downstream edge of the slot housing. When a splice plate 14 is installed between first and second roofing panels, the concealing tab 42 hides a gap between the first and second roofing panels, as shown best in FIG. 5. In particular, the concealing tab 42 hides the gap between the respective hems 26 of the laterally disposed roofing panels 12. The length of the concealing tab 42 may be such that a distal end of the tab is in general alignment with the lowest portion of the hems 26.

A splice plate may also include first and second apron extensions 43, 45 located at the upstream edges of the first and second aprons 38 and 40, respectively. The first and second apron extensions 43, 45 extend in an upstream direction beyond the risers 22 of the laterally disposed roofing panels. The apron extensions 43, 45 may be inclined to prevent water situated in the checks 30 or slots 32, 34 from moving in an upstream direction when there are gusts of wind in the upstream direction. The incline angle can be as small as 5 degrees or less, or it can be up to a 90 degree angle in relation to the aprons 38, 40. This in turn helps prevent water from entering the space beneath the roofing panels 12. Similarly, a splice plate 14 may include a riser 44 extending from an upstream edge of the slot housing to prevent water on the roofing system from blowing through the gap between the first and second roofing panels 12. In particular, the splice plate riser 44 covers the gap between the respective risers 22 of the laterally disposed roofing panels and is generally located on the downstream side of the roofing panel risers 22.

The typical splice plate 14 can be formed from a single piece of sheet metal using known techniques and may be painted or coated to aesthetically blend with the appearance of the photovoltaic material 16 and to prevent corrosion of the splice plate. The splice plate 14 can also be made from other materials such as plastics or composite materials.

The system 10 may also include closure assemblies as shown in FIGS. 1, 2, and 10-12. As best shown in FIG. 2, the closure assemblies are disposed along or near the edges of the roofing panels 12 to close off the open side gap. As shown best in FIG. 7, the side gap is formed under the lower or downstream portion of each roofing panel as that portion engages the receiving flange 24 on the roofing panel 12 beneath it.

One such closure assembly comprises a cover support generally indicated at 46 and a cover generally indicated at 48. One embodiment of a cover support 46 is shown in FIGS. 10 and 11. The cover support 46 includes an apron 50 for extending under the roofing panel, with the apron 50 including a check 52 along one edge of the apron. The cover support 46 also includes a slot housing 54 connected to the apron 50 at its opposite edge and forming a slot for receiving an edge of a roofing panel 12. A pocket housing 57 is disposed above the slot housing 54 and defines a pocket. The pocket housing 57 may take various shapes, and it includes a cover mounting flange 58. In the embodiment shown in the figures, the cover mounting flange 58 is supported by a generally vertical side wall 56 that extends up from a pocket housing base 55. The pocket housing 57 may be made in other shapes to support its cover mounting flange 58. As indicated in FIG. 2, the pocket defined by the pocket housing 57 is sized to receive an entire edge of a roofing panel 12 including an edge of the roofing panel receiving flange 24. Cover supports 46 may be constructed in left-hand and right-hand versions for fitting to opposite ends of rows of roofing panels 12 of a complete roofing system 10.

The cover support 46 may also include a tab 53 extending from a downstream edge of apron 50. The tab 53 in this embodiment is configured to extend into a trough 23 of a downstream roofing panel 12, similar to tabs 33, 35 of the splice plate 14 previously described. This allows any water that flows between the edge of a roofing panel 12 and the cover support 46 to be channeled by the slot and check 52 of the cover support and directed into a downstream trough 23 via tab 53. The downstream trough 23 can then distribute the water away from the closure assembly and over the downstream roofing panel 12. The closure assembly may also include an inclined apron extension (not shown) at an upstream edge of apron 50 of cover support 46 to prevent water flow off of the apron 50 in an upstream direction, particularly in the event of wind gusts in the upstream direction. This apron extension may be similar to the apron extensions 43, 45 described previously in connection with splice plate 14.

Figure 12:
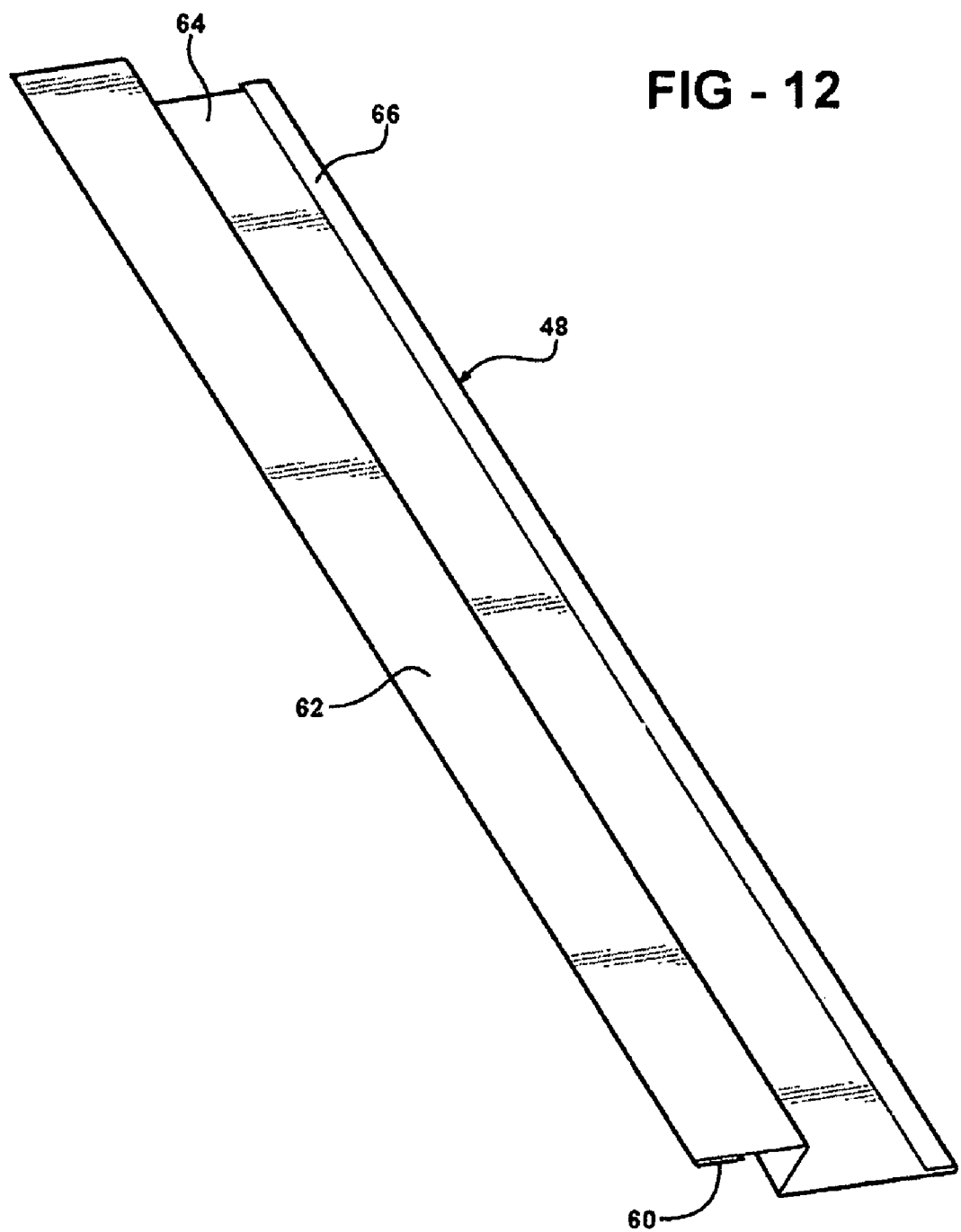
FIG. 12 is a perspective view of an embodiment of a cover.

The closure assembly may also include a cover 48 for mounting on the cover support 46. One embodiment of a cover 48 is shown in FIG. 12. The cover 48 includes a hem 60 that is adapted to engage the cover mounting flange 58. The cover 48 may include a cover box 62 that extends away from the hem and an apron 64 that extends from the cover box 62 and ends in a distal check 66. When installed on a roof, the apron 64 may extend beneath other roofing materials (e.g., shingles) adjacent to the roofing system 10. The cover 48 may be constructed in different shapes that can attach to the cover mounting flange 58 and extend to the roof to close off the open side gap. The cover 48 may also be sized to conceal any electrical wiring that may extend from the photovoltaic sheets 16 of the roofing panels 12 while simultaneously concealing the side gap formed under the lower or downstream portion of each roofing panel 12. Such wiring is shown in phantom in FIG. 1 and elsewhere in the other figures. The embodiment shown in FIG. 12 is advantageous because its continuous cross-section allows left-hand and right-hand covers to be interchangeable and allows a variety of forming techniques such as bending, molding, or extrusion from a variety of materials such as metals, plastics, or composites.

Figure 7:
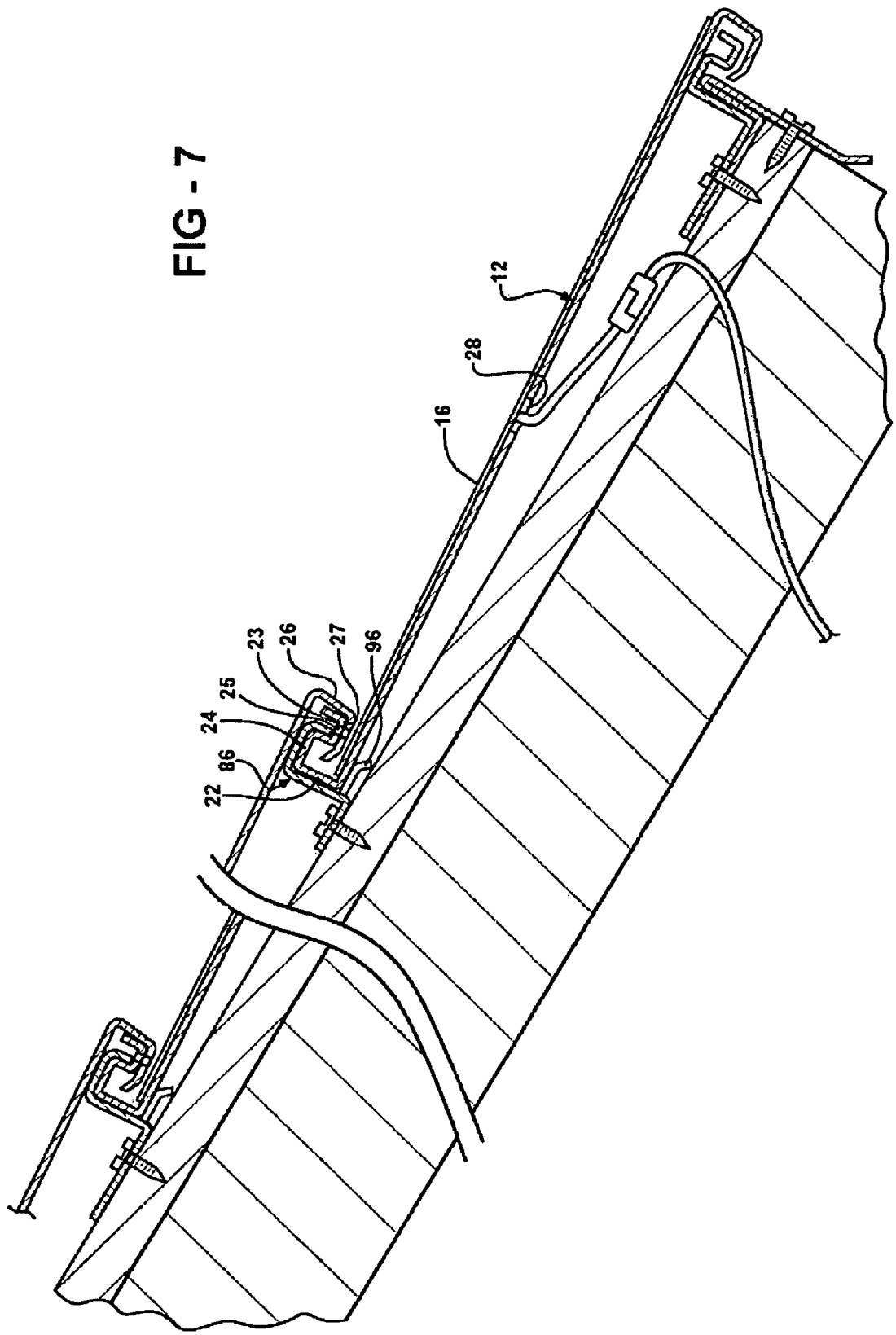
FIG. 7 is a side sectional view showing the roofing panels of a kit installed on a roof.

The system 10 may include anchoring clips 86, shown generally in FIG. 2 and shown in an exemplary embodiment in FIGS. 7, 13, and 14. Anchoring clips 86 can help secure roofing panels 12 to a roof, particularly the upstream edges of the roofing panels 12. An anchoring clip generally comprises a bracket portion 88, a hem 94, and a spacing element 96. The bracket portion 88 includes a base 90 for attaching to the roof using standard roofing fastening techniques. A support 92 extends up from the base 90. The hem 94 extends from the support 92 and is shaped to engage at least a portion of a receiving flange 24 of the roofing panel 12 that it is securing to the roof. Spacing element 96 extends from bracket portion 88 generally in the same direction as the hem 94. The spacing element 96 serves to space an upstream edge of roofing panel 12 away from the roof, as shown best in FIG. 7. This allows better air circulation beneath adjacent roofing panels and helps keep the panels and the roofing system 10 cooler in general. This is advantageous to the operation of the photovoltaic sheets 16 that operate more efficiently at lower temperatures. When assembled to a roofing panel 12, the hem 94 and the spacing element 96 of the anchoring clip constrain the roofing panel in the vertical direction to prevent lifting of the roofing panel 12. Support 92 prevents movement of the roofing panel 12 in the upstream direction in the event of strong winds. In the embodiment shown in the figures, the hem 94 is shaped to engage an inside surface of a trough 23 of a receiving flange 24 of the roofing panel 12. This is best shown in FIG. 7. In this embodiment a flange extends into the trough 23 and prevents movement of the roofing panel in the downstream direction. In this manner, an anchoring clip 86 can be used to secure a roofing panel in all directions if desired. The hem 94 may also be configured to engage other portions of the receiving flange 24 such as an opposite side of the trough 23 or the bottom 27 of the trough 23 or other portions of other embodiments of receiving flanges 24 not shown.

In the embodiment shown in the figures, spacing element 96 is shown extending from the base portion 90 of the bracket 88 and through an opening in support 88. It will be appreciated that spacing element 96 can extend from any portion of bracket 88 so long as it serves its function of spacing a roofing panel 12 from the roof. In this embodiment, spacing element 96 is located and configured to contact the roof to support the roofing panel 12, but it need not contact the roof if it is sufficiently strong to support the roofing panel on its own. Where fasteners are used to secure the anchoring clip 86 to the roof, holes 98 may be provided.

The roofing system 10 may also include at least one flashing. Flashings come in a variety of shapes and sizes to deal with a variety of applications. FIGS. 1, 2 and 7 show some possible flashings, primarily a drip or eave edge 82 and top flashings 84. The drip edge 82 includes a standard front drip edge, an apron for extending up the roof edge, and a mounting flange for receiving the hem of the first (lowest) roofing panel 12.

Top flashings 84 are shown in FIGS. 1 and 2. These are sheets that include a hem on one edge for hooking onto the top-most roofing panels 12, and a crease or bend located toward the other edge for transitioning back to the roof slope. Splice plates can be used to connect the side edges of adjacent flashings 84.

Other flashing possibilities (not shown) include a rake edge and a starter strip. The rake edge is used when the edge of the solar panel system is at the side edge of the roof itself. The kit 10 that is shown in FIGS. 1 and 2 is installed in a location spaced away from the side edge of the roof, and so rake edges are not needed in that instance. The rake edge, when used, includes a top cover having a clip or hem that attaches to the closure such as cover support 46; a side cover that protects the side edge of the closure and the roof edge; and a drip edge extending down and away from the side cover.

For flashing the bottom or front edge of a roof, the system could provide a starter strip that includes typical starter strip features—an eave edge, and front cover, and a top cover. The roofing panels can then be mounted on the roof above this and overlapping the top cover.

Various other flashings (e.g. stack flashings) can and should be used to flash around vents, walls, HVAC units, etc. These can include material that is shaped and colored to resemble the roofing panels.

As the reader can appreciate, the various kit elements, including the roofing panels 12, the splice plates 14, the closures and the flashings, fit together in a terraced fashion to create a type of Bermuda-style roof. This is shown best in FIGS. 1, 2, and 7. The figures depict the steps created by the risers 22, and they show the overall terracing effect of the construction. This permits water to flow down and off the roof, and the edges of the photovoltaic sheet material 16 will not buck the water as it does. This is because the water flowing off the preceding or upstream roofing panel 12 will flow over the edge of the sheet material 16 on the lower roofing panel. Additionally, water between laterally disposed roofing panels 12 is channeled and directed by the specially configured splice plates 14 and directed into troughs 23 of downstream roofing panels for distribution over the length of the roofing panels 12 and roofing system in general. Moreover, the height of the terracing impairs the possible movement of flame up the roof, and so the photovoltaic sheet material 16 will benefit from a higher fire safety rating even on higher pitched roofs. Finally, the steps created by the risers 22 create a clearance underneath the roofing panels to provide for the running of the electric wires from the photovoltaic sheet material 16. This shelters and covers the wires under the roofing panels, and it allows the roofer to select where to feed the wires through the roofing. Accordingly, the wires need not run above the photovoltaic sheets 16.

Obviously, many modifications and variations of the present invention are possible in light of the above teachings. As just one example, the roofing components are typically made from sheet metal, but they could be made from a variety of other materials including wood, plastics, composites, etc. Also, while the components are typically formed with sheet metal bending and forming equipment, they can typically also be formed using known extrusion or molding techniques. Therefore, it is to be understood that within the scope of the appended claims the invention may be practiced otherwise than as specifically described. Moreover, the reference numerals and labels are merely for convenience and are not intended to be in any way limiting.

I claim:

1. A photovoltaic roofing panel, comprising:
   a support plate,
   a riser extending from an upstream edge of the support plate to an end that is elevated above the support plate,
   a receiving flange having a trough and extending over the support plate from the end of the riser to the trough in a direction towards a downstream edge of the support plate, the trough extending along the receiving flange for receiving water flowing down the roof and distributing the water over the support plate, a hem extending from a downstream edge of the support plate shaped to engage at least a portion of a receiving flange of an adjacent downstream roofing panel, and a photovoltaic material disposed over the support plate with an upstream edge of the photovoltaic material being disposed under the receiving flange, wherein the support plate, riser, receiving flange, and hem together comprise a single piece of sheet metal, and wherein the trough has a bottom that is spaced from the support plate such that the photovoltaic material and hem of an adjacent upstream roofing panel can fit under the trough between the support plate and trough, the hem having at least one weep hole to permit water received from the trough of the adjacent downstream roofing panel to exit the hem onto the adjacent downstream roofing panel at a location below the upstream edge of the photovoltaic material of the adjacent downstream roofing panel.

2. The roofing panel of claim 1 wherein the trough defines at least one weep hole for draining water from the trough into the hem of the adjacent upstream roofing panel.

3. The roofing panel of claim 2 wherein each of the one or more weep holes in the trough are aligned with a corresponding one of the weep holes in the hem.

4. The roofing panel of claim 1 wherein the hem engages the bottom of the trough of the adjacent downstream roofing panel.

5. The roofing panel of claim 1 wherein the photovoltaic material is flexible.

6. The roofing panel of claim 1 wherein an adhesive is disposed between the photovoltaic material and the support plate.

* * * * *